United States Patent
Chang et al.

(10) Patent No.: US 9,559,284 B2
(45) Date of Patent: Jan. 31, 2017

(54) SILICIDED NANOWIRES FOR NANOBRIDGE WEAK LINKS

(71) Applicant: GLOBALFOUNDRIES INC., Grand Cayman (KY)

(72) Inventors: Josephine B. Chang, Bedford Hills, NY (US); Paul Chang, Bedford Hills, NY (US); Guy M. Cohen, Ossining, NY (US); Michael A. Guillorn, Cold Spring, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 93 days.

(21) Appl. No.: 14/659,749

(22) Filed: Mar. 17, 2015

(65) Prior Publication Data

US 2016/0276570 A1    Sep. 22, 2016

(51) Int. Cl.
| | | |
|---|---|---|
| *B05D 5/12* | (2006.01) | |
| *H01L 39/02* | (2006.01) | |
| *H01L 39/22* | (2006.01) | |
| *H01L 39/24* | (2006.01) | |

(52) U.S. Cl.
CPC ........... *H01L 39/025* (2013.01); *H01L 39/223* (2013.01); *H01L 39/2493* (2013.01); *B05D 5/12* (2013.01); *H01L 39/2467* (2013.01)

(58) Field of Classification Search
USPC ......................................... 427/62, 98.8, 307
See application file for complete search history.

(56) References Cited

U.S. PATENT DOCUMENTS

| | | | | |
|---|---|---|---|---|
| 5,109,164 | A * | 4/1992 | Matsui ................. | H01L 39/225 257/34 |
| 7,285,804 | B2 * | 10/2007 | Quek ..................... | H01L 21/84 257/124 |
| 7,749,922 | B2 | 7/2010 | Bezryadin et al. | |
| 7,884,004 | B2 | 2/2011 | Bangsaruntip et al. | |
| 2010/0090197 | A1 * | 4/2010 | Park ...................... | B82Y 10/00 257/20 |
| 2012/0305893 | A1 * | 12/2012 | Colinge ................ | B82Y 10/00 257/29 |
| 2013/0146335 | A1 | 6/2013 | Gambino et al. | |
| 2013/0196855 | A1 | 8/2013 | Poletto et al. | |
| 2013/0203191 | A1 | 8/2013 | Mongillo et al. | |

(Continued)

FOREIGN PATENT DOCUMENTS

WO    2005093831 A1    10/2005

OTHER PUBLICATIONS

Hardy et al., "The Superconductivity of Some Transition Metal Compounds", Physical Review, vol. 93, No. 5, Mar. 1, 1954, pp. 1004-1016.

(Continued)

*Primary Examiner* — Brian K Talbot
(74) *Attorney, Agent, or Firm* — Anthony Canale; Hoffman Warnick LLC

(57) ABSTRACT

Silicided nanowires as nanobridges in Josephson junctions. A superconducting silicided nanowire is used as a weak-link bridge in a Josephson junction, and a fabrication process is employed to produce silicided nanowires that includes patterning two junction banks and a rough nanowire from a silicon substrate, reshaping the nanowire through hydrogen annealing, and siliciding the nanowire by introduction of a metal into the nanowire structure.

12 Claims, 4 Drawing Sheets

(56) References Cited

U.S. PATENT DOCUMENTS

2013/0320455 A1* 12/2013 Cappellani ........ H01L 29/66795
257/368
2013/0328162 A1* 12/2013 Hu ...................... H01L 27/0629
257/526
2014/0103435 A1* 4/2014 Basker .............. H01L 29/66795
257/347

OTHER PUBLICATIONS

Kim et al., "Direct Electrical Measurement of the Self-Assembled Nickel Silicide Nanowire," Nano Letters, vol. 6, No. 7, 2006, pp. 1356-1359.

Ku et al., "Superconducting nanowires as nonlinear inductive elements for qubits," Physical Review B, vol. 82, No. 13, 2010, 134518, DOI: 10.1103/PhysRevB.82.134518, 11 pages.

Levenson-Falk et al., "Nonlinear microwave response of aluminum weak-link Josephson oscillators," Applied Physics Letters, vol. 98, No. 12, 2011, 123115, 3 pages.

Mann et al., "Silicides and local interconnections for high-performance VLSI applications", IBM J. Res. Develop, vol. 39 No. 4, Jul. 1995, pp. 403-417.

Vijay et al., "Approaching ideal weak link behavior with three dimensional aluminum nanobridges," Applied Physics Letters, vol. 96, No. 22, 2010, 223112, 3 pages.

\* cited by examiner

100

200

SILICIDED NANOWIRES FOR NANOBRIDGE WEAK LINKS

BACKGROUND OF THE INVENTION

The present invention relates generally to the field of silicides for nanometer scale structures such as nanowires, and also to nanowires used in nanobridges.

A silicide is a metal-silicon alloy, where the metal may be any metal capable of forming such as alloy, including cobalt, nickel, niobium, palladium, platinum, tungsten, and others in various combinations with silicon as known to those of ordinary skill in the art.

A nanowire, as the name implies, is an elongated nanoscale structure having a transverse cross-sectional diameter on the order of several nanometers (1 nm=$10^{-9}$ meters) or thereabouts (for example, from about 3 nm to 100 nm). At these scales, quantum mechanical effects are important enough that the properties of nanowires may vary significantly from those of larger elongated physical structures. Currently, nanowires are used in nanoelectronic devices and nanophotonic devices.

Quantum computing is a known paradigm for computing which is based on a fundamentally different style of computation than the classical digital computing model. While the smallest piece of information in a classical digital computer, a bit, can be in only one of two states at any given time (either '0' or '1'), the smallest piece of information in a quantum computer, a quantum bit, or qubit, can be in both states simultaneously. This property of qubits is expected to permit a quantum computer to more efficiently solve computational problems that are hard to address with a classical computer.

One known proposal for making a practical computing device using qubits (specifically qubits capable of maintaining quantum coherence) and other quantum circuit devices involves components that include one or more Josephson junctions. A typical Josephson junction includes two superconductors coupled together by a weak-link bridge, such as an insulator or a thin superconducting wire (Dayem bridge). One known type of weak-link bridge, called a "nanobridge," is formed by one or more metallic nanowires.

SUMMARY

According to an aspect of the present invention, there is a method for forming a superconducting weak-link junction that performs the following steps (not necessarily in the following order): (i) patterning a first junction bank, a second junction bank, and a rough nanowire from a silicon substrate; (ii) reshaping the nanowire through hydrogen annealing; and (iii) siliciding the nanowire by introduction of a metal into the nanowire. The nanowire is shaped, sized, structured, located and/or connected to form a weak-link bridge between the first junction bank and the second junction bank.

According to a further aspect of the present invention, there is a method for forming a superconducting weak-link junction that performs the following steps (not necessarily in the following order): (i) patterning a first junction bank, a second junction bank, and a rough nanowire from a silicon substrate; (ii) reshaping the nanowire through hydrogen annealing; and (iii) siliciding the nanowire by diffusion of a metal through at least the first junction bank. The nanowire is shaped, sized, structured, located and/or connected to form a weak-link bridge between the first junction bank and the second junction bank.

According to a further aspect of the present invention, there is a superconducting junction comprising: (i) a first junction bank; (ii) a second junction bank; and (iii) a silicided nanowire. The silicided nanowire is shaped, sized, structured, located and/or connected to form a weak-link bridge between the first junction bank and the second junction bank.

DETAILED DESCRIPTION

Figure 1:
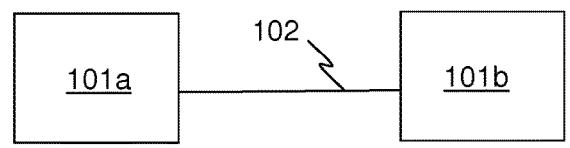
FIG. 1 is an orthographic top view of a first embodiment of a semiconductor structure according to the present invention.

Some embodiments of the present invention use silicided nanowires as nanobridges for qubit applications and/or weak-link bridges in weak-link bridge devices. In some embodiments of the present invention: (i) a superconducting silicided nanowire is used as a weak-link bridge in a Josephson junction; and/or (ii) a fabrication process is employed to produce silicided nanowires with tightly controlled properties, including dimensions and/or crystalline structures, appropriate for use in such junctions, and particularly for use in qubit applications.

Some embodiments of the present invention include one or more of the following features, characteristics, and/or advantages: (i) a process that selectively produces a single-crystal silicided nanowire or a poly-crystalline silicided nanowire (the electronic properties of single-crystal versus poly-crystalline silicides may differ); (ii) a process that provides excellent control over the nanowire's cross-section (for example, making a rectangular cross-section and rounding the rectangle shape to achieve a near perfect circular cross-section); (iii) a process wherein the degree of nanowire sidewall smoothness obtained exceeds what is typically obtained by processes like lithography or reactive-ion etching (RIE); (iv) a process wherein the silicide phase that forms in the wire is controlled (for instance, NiSi versus $NiSi_2$); and/or (v) a nanowire possessing one or more of the properties presented in (i)-(iv).

Some embodiments of the present invention recognize one or more of the following facts, potential problems and/or potential areas for improvement with respect to the current state of the art: (i) nanobridge weak-link junctions may be used to replace tunnel junctions for various applications, such as qubits (nanobridge weak-link junctions may be used anywhere that Josephson junctions are used, but are especially applicable to qubits because it is of interest in qubit applications to have extremely precise control of the qubit resonance frequency, which depends strongly on the electrical properties of the weak link); (ii) advantages of nanobridge weak-link junctions include (a) no lossy tunneling oxide, and/or (b) the potential to attain more precise control of nanobridge dimensions than of the thickness, gap, and/or height of the tunneling barrier in tunnel junctions; and/or (iii) there are nevertheless difficulties in forming a superconducting nanobridge of high-quality material and/or having well-controlled dimensions. High-quality material means, for example, materials having particular functional properties (such as superconducting), a particular uniformity or non-uniformity of structure (such as a single-crystalline lattice of a certain unit cell type), and/or a particular combination of more fundamental substances (such as silicon and nickel in a specific stoichiometric proportion). Having well-controlled dimensions may include having parameters such as cross-sectional radius, smoothness, and/or shape to within a tolerance of some specification (accuracy), as well as having a variability of such parameters to within a tolerance of some specification (precision). Tight dimensional control, structural control (for example, single-crystal), and compositional control are very important for making a device with predictable characteristics. For example, for normal conductivity, the resistance of a nanowire depends strongly on surface roughness and grain boundaries, both of which contribute to scattering.

Further, some embodiments of the present invention recognize: (i) that aluminum nanobridges may be used for weak links in Josephson junctions; (ii) that aluminum nanobridges suffer from polycrystallinity as well as surface roughness from direct patterning; (iii) that a number of silicides, which may herein be referred to as quantum-capable silicides (QCSs), are superconducting at the millikelvin (mK) temperatures at which qubits and/or other quantum circuits are operated (for example, $CoSi_2$ at 1.4 mK, PtSi at 0.88 mK, $Nb_3Si$ at 1.5 mK, PdSi at 0.93 mK, and WSi at 1.8 mK to 4 mK); (iv) that silicon nanowires may be silicided in a single-crystalline fashion using, for example, nickel silicide (NiSi) (silicides having low formation temperatures, such as NiSi, PtSi, PdSi, or CuSi, may be easier to use when forming silicided nanowires because it is the metal that diffuses into the silicon; if silicon were to diffuse into the metal, the formation of voids might be likely to occur); and/or (v) that such silicided nanowires may therefore be used as weak links.

Shown in FIG. 1 is structure 100, according to an embodiment of the present invention. Structure 100 includes: first junction bank 101a; second junction bank 101b; and silicided nanobridge (nanowire) 102. Structure 100 is a Josephson junction, so junction banks 101a and 101b are superconducting at operational temperatures, and silicided nanobridge 102 is the weak link between these banks. In general, the banks may be any superconducting material and do not have to be identical, as long as the junction is operated at a temperature at which both banks are superconducting. The direction, cross-sectional shape, uniformity, length, diameter, and other such properties of nanobridge 102 affect the normal resistance/loss of the weak link. These properties can all be modified in design to achieve desired electrical characteristics. Nanowire 102 can be normal or insulating or superconducting, with the lengths/diameter ranges required in each case varied accordingly.

Figure 2:
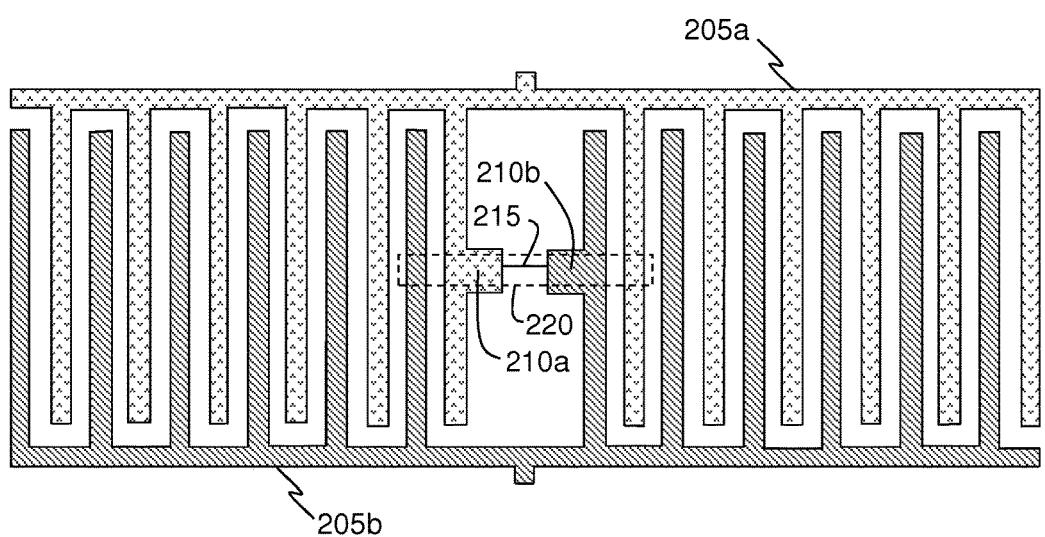
FIG. 2 is an orthographic top view of a second embodiment of a semiconductor structure according to the present invention.

Shown in FIG. 2 is an orthographic top view of silicided semiconductor structure 200 according to a second embodiment of the present invention. In this case, the entire structure 200 is silicided. Alternatively, only a part of the structure is silicided. Before the basic silicon structure was reacted with a metal, it was a semiconductor. After being converted into a silicide, it has metallic properties. Structure 200 is a superconducting anharmonic inductor-capacitor (LC) resonator employing a Josephson junction with a silicided nanobridge weak link as the inductive component. This LC resonator may be used as, or as a part of, the physical support for a qubit, including one based on charge, flux, and/or phase of the qubit's information-carrying component. Structure 200 is formed on an insulating substrate (not shown) and includes: capacitor arms 205a and 205b; junction banks 210a and 210b; and silicided nanowire (nanobridge) 215. A cross-sectional view of the portion of structure 200 enclosed by dashed line 220 is shown in FIGS. 4A through 4E at various stages of an exemplary fabrication process summarized in flowchart 350 of FIG. 3, to which this discussion now turns.

Figure 3:
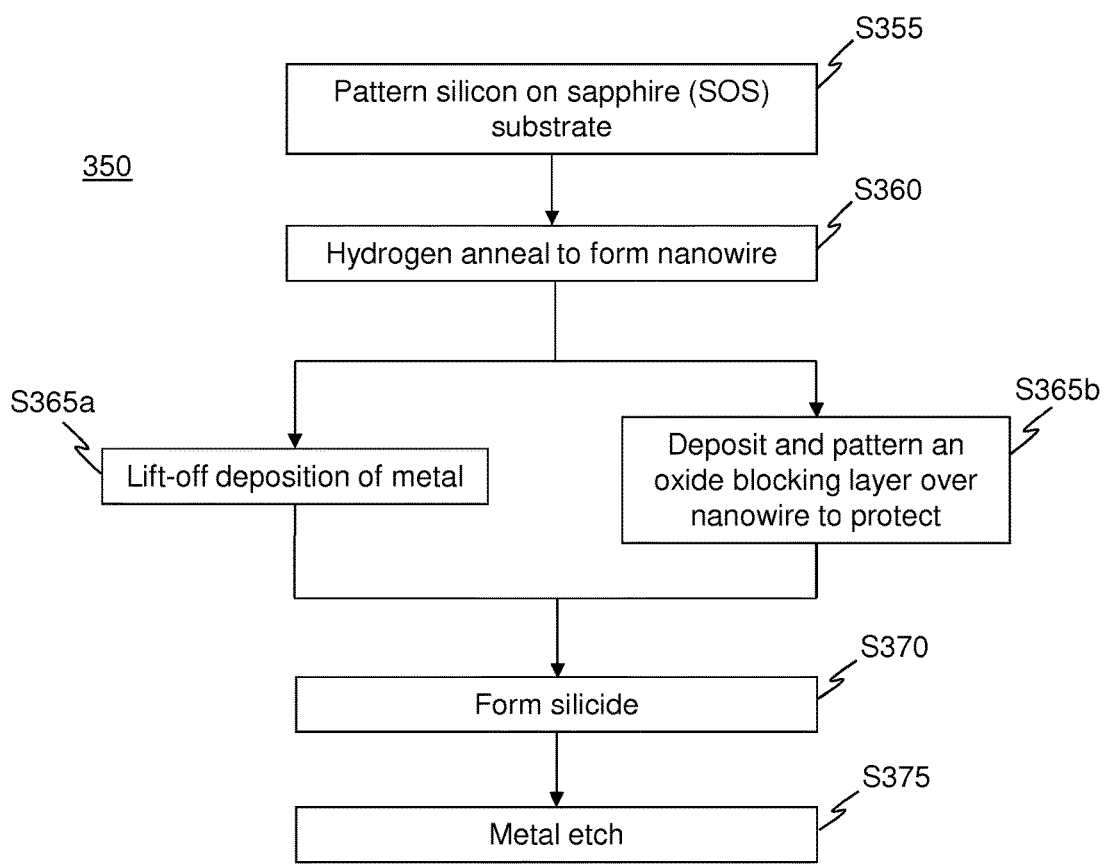
FIG. 3 is a flowchart summarizing a method for producing the second embodiment structure according to the present invention.

The exemplary process begins at step S355 of FIG. 3, where the silicon layer of a silicon on sapphire substrate (SOS) is patterned in the shape of the circuit of FIG. 2. Sapphire is chosen here because it is non-lossy with respect to microwave frequencies, a property desirable for structure 200 when used in qubit applications. SOS provides minimal losses of microwave transmission lines over sapphire. High-quality, single-crystal silicon films can be made over sapphire, and indeed the making of SOS wafers is now a commercial process. However, other substrates known to those of ordinary skill in the art could also be used. Patterning of the circuit is done by conventional techniques, such as photolithography.

Figure 4A:
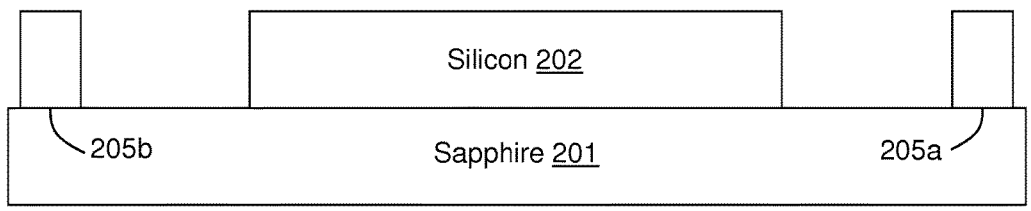
FIG. 4A is a cross-sectional view of a portion of the second embodiment structure at a first stage of the production method.

The result of step S355 is shown in FIG. 4A with respect to the portion of structure 200 enclosed by dashed line 220 (see FIG. 2). Note that silicon layer portion 202 is the precursor to junction banks 210a and 210b and nanowire 215. FIG. 4A also shows insulating substrate (sapphire) 201. At this point, nanowire 215 has been roughly patterned in the shape of a vertical fin by conventional techniques, such as lithography followed by reactive ion etching (RIE). Both the photoresist used in lithography and the RIE process contribute to line-edge roughness (LER) in the patterned nanowire (the "rough nanowire").

Figure 4B:
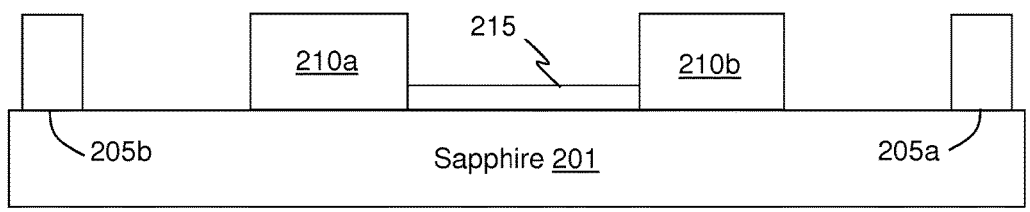
FIG. 4B is a cross-sectional view of a portion of the second embodiment structure at a second stage of the production method.

Processing proceeds to step S360, where the rough nanowire is finely thinned, shaped, and smoothed into a refined nanowire to within tight tolerances by hydrogen annealing. Thermal annealing under pressure in a hydrogen ambient is capable of producing smooth, rounded surfaces and uniform cross-sectional areas at the atomic scale, with the specific outcome highly controllable via manipulation of annealing process parameters, such as temperature, pressure, and time. The result of this step is illustrated in FIG. 4B, where junction banks 210a and 210b and nanowire 215 have now fully taken shape from silicon layer portion 202. For further information about hydrogen annealing as a tool for the fabrication of silicon nanowires, see, for example, "field-effect transistor; dielectrics; ladder-like configuration formed in silicon-on-insulator layer over buried oxide (BOX) layer," U.S. Pat. No. 7,884,004 B2, the entire content of which (including all text and all drawings) is hereby incorporated by reference.

Figure 4C:
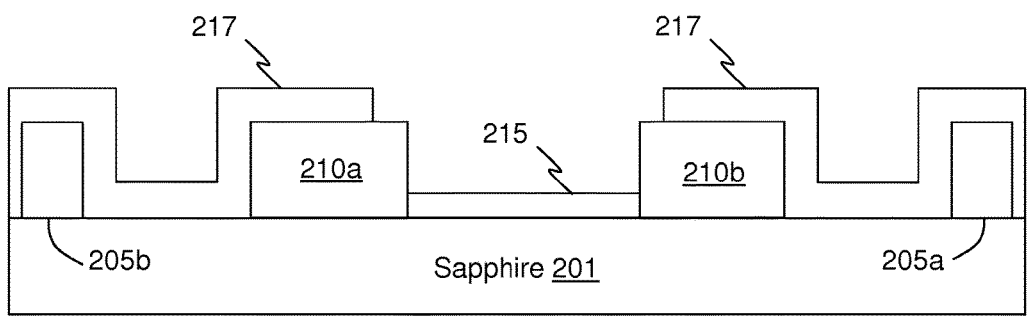
FIG. 4C is a cross-sectional view of a portion of the second embodiment structure at a third stage of the production method.

Processing proceeds to step S365a, where the siliciding metal of choice—Ni in this case—is deposited through an additive lift-off technique. This leaves metal layer portions 217 in the places where the sacrificial layer (typically photoresist) was not present prior to being lifted off, as shown in FIG. 4C. Step S365b lists an alternative approach, where an oxide blocking layer is deposited and patterned over nanowire 215 to protect it from forming silicide by direct reaction as opposed to epitaxial growth of the silicide.

In other words, to obtain a single crystal silicide the metal (for example, Ni) is deposited over the ends of the wire but not over the wire's body. When the wafer is annealed the metal reacts with the silicon. The metal diffuses from the ends of the wires and forms an epitaxial single-crystal metal silicide (such as NiSi or NiSi2). If the wire were not protected by resist or an oxide, then metal would cover the body of the wire and, when annealed, the metal would reacts simultaneously with all parts of the wire. Regions of silicide poly-crystals would form along the body of the wire as a result.

The use of an oxide rather than lift-off is an alternative since the metal does not react with the oxide. Following the anneal, areas where the metal is in direct contact with the silicon transform into a silicide. Areas where the metal is in contact with the oxide remain as metal. A selective etch that attacks the metal but does not attack the silicide is then applied to etch the unreacted metal. This process is referred to in the literature as the "salicide process" (self-aligned silicide process).

Processing proceeds to step S370, where a silicide is formed via diffusion of metal layer portions 217 into the adjacent bulk silicon features of the sample, including 205a, 205b, 210a, and 210b, during a second annealing process. This second annealing process is different than the hydrogen annealing of step S360. For instance, in this embodiment, the hydrogen annealing temperature used in step S360 is about 850° C., whereas the annealing temperature in this step is lower. In general, the annealing temperature for silicide formation depends on the metal and the desired phase. For Ni, for example, a 400-500° C. anneal would form NiSi, while a 650° C. anneal would form $NiSi_2$.

Figure 4D:
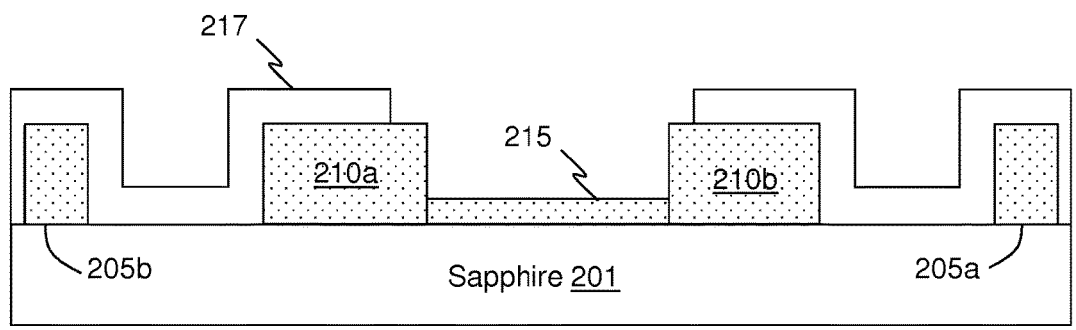
FIG. 4D is a cross-sectional view of a portion of the second embodiment structure at a fourth stage of the production method.

As the metal continues to diffuse into the bulk silicon features of the sample, it also diffuses across nanowire 215. The annealing parameters are controlled such that this diffusion occurs in an epitaxial fashion across the entire length of the nanowire, resulting in a silicided nanowire having a single crystalline domain of the desired metal-silicon phase. FIG. 4D shows the result of this silicidation step, where the silicon portions of the sample enclosed by dashed line 220, including junction banks 210a and 210b and nanowire 215, are now transformed into a silicide (NiSi in this example). Because diffusion takes place from both sides of the wire, a grain boundary is formed where the two crystals meet. This can be avoided by altering the process slightly, such as depositing metal on only one end of the wire and annealing and then, once the entire wire has been silicided, depositing metal on the rest of the structure and annealing again.

Figure 4E:
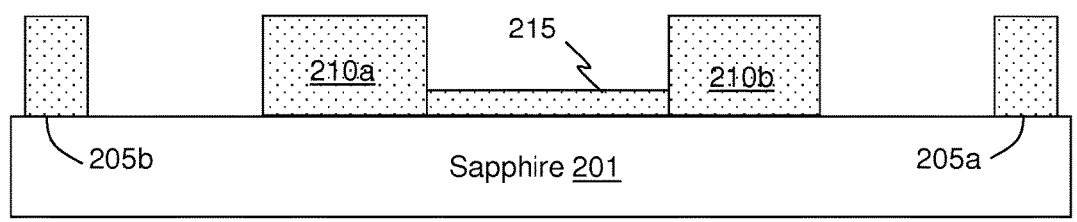
FIG. 4E is a cross-sectional view of a portion of the second embodiment structure at a fifth stage of the production method.

Processing proceeds to step S375, where the metal layer portions 217 are removed through a metal etching process, leaving the desired circuit pattern, including nanowire 215, in silicide form. This result is depicted in FIG. 4E.

The process described above can produce silicided nanowires having cross-sectional areas in at least the range of 3 nm to 200 nm, and line-edge roughnesses lower than 0.5 nm (the roughness of the silicon wire after being reshaped by hydrogen annealing is less than 0.5 nm; if the silicide is grown as a single-crystal material, this roughness is maintained; if the silicide is formed as poly-crystalline material, this roughness may increase). This exemplary process is not meant to be limiting, and those of ordinary skill in the art will recognize that variations to this process may be made without departing from the scope and spirit of the invention disclosed herein.

Some embodiments of the present invention may include one or more of the following features, characteristics, and/or advantages: (i) include silicide nanowires and/or metal silicide nanobridges; (ii) include nanobridge junctions formed from silicided nanowires; (iii) include a superconducting weak link; (iv) include structures which are superconducting at temperatures useful for qubits; (v) use silicided nanowires as nanobridges for qubit applications; (vi) use silicided nanowires for nanobridge weak links in qubits; (vii) use metal silicide nanowires as weak-link nanobridge junctions for qubits; (viii) are used in transmission line shunted plasma oscillation qubits (transmons); (ix) include a method for creating metal silicide nanowires; and/or (x) include a structure and method for forming a qubit structure which results in low variability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Reshaping: changing the shape characteristics of a physical structure, including surface smoothness, cross-sectional diameter, and/or cross-sectional form (for example, a square cross-section versus a circular cross-section).

Quantum-capable silicide (QCS): a silicide that exhibits superconducting properties under the operating conditions of a circuit component designed to exploit quantum-mechanical principles.

What is claimed is:
1. A method for forming a superconducting weak-link junction, the method comprising:
    patterning a first junction bank, a second junction bank, and a rough nanowire from a silicon substrate;
    reshaping the nanowire through hydrogen annealing; and
    siliciding the nanowire by introduction of a metal into the nanowire, wherein the nanowire is at least one of shaped, sized, structured, located or connected to form a weak-link bridge between the first junction bank and the second junction bank.

2. The method of claim 1 wherein the silicidation results in a single domain of a single-crystal silicide throughout the extent of the nanowire.

3. The method of claim 1 wherein the metal is one of: cobalt, nickel, niobium, palladium, platinum, or tungsten.

4. The method of claim 1 wherein the silicidation results in formation of a nickel silicide throughout the extent of the nanowire having a one-to-one stoichiometric relationship between nickel and silicon and a chemical formula NiSi.

5. The method of claim 1 wherein the metal is applied through a lift-off deposition process.

6. The method of claim 1 wherein the silicon substrate is located on top of a sapphire substrate.

7. A method for forming a superconducting weak-link junction, the method comprising:
patterning a first junction bank, a second junction bank, and a rough nanowire from a silicon substrate;
reshaping the nanowire through hydrogen annealing; and
siliciding the nanowire by diffusion of a metal through at least the first junction bank,
wherein the nanowire is at least one of shaped, sized, structured, located or connected to form a weak-link bridge between the first junction bank and the second junction bank.

8. The method of claim 7 wherein:
diffusion of the metal through the first junction bank results in silicidation of a first portion of the nanowire; and
the silicidation of the first portion of the nanowire produces a single domain of a single-crystal silicide in the first portion of the nanowire.

9. The method of claim 7 wherein the silicidation results in a single domain of a single-crystal silicide throughout the extent of the nanowire.

10. The method of claim 7 wherein the reshaping produces a nanowire having a cross-sectional diameter in the range of 3 nanometers to 200 nanometers.

11. The method of claim 7 wherein the reshaping produces a nanowire having a line-edge roughness of less than 0.5 nanometers.

12. The method of claim 7 wherein the silicidation results in formation of a nickel silicide throughout the extent of the nanowire having a one-to-one stoichiometric relationship between nickel and silicon and a chemical formula NiSi.

* * * * *